(12) United States Patent
Yoshida et al.

(10) Patent No.: US 7,022,412 B2
(45) Date of Patent: Apr. 4, 2006

(54) MEMBER HAVING METALLIC LAYER, ITS MANUFACTURING METHOD AND ITS APPLICATION

(75) Inventors: Hiroshi Yoshida, Mito (JP); Toshiro Saito, Hatoyama (JP); Haruo Akahoshi, Hitachi (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/452,291

(22) Filed: Jun. 3, 2003

(65) Prior Publication Data
US 2003/0215620 A1 Nov. 20, 2003

Related U.S. Application Data

(63) Continuation of application No. 10/130,851, filed as application No. PCT/JP99/06597 on Nov. 26, 1999.

(51) Int. Cl.
*B32B 15/08* (2006.01)
*B32B 15/16* (2006.01)
*H05K 1/03* (2006.01)
*H05K 1/05* (2006.01)

(52) U.S. Cl. .................. 428/477.7; 174/255; 174/258; 174/259; 428/474.4

(58) Field of Classification Search ............. 428/473.5, 428/474.4, 477.7, 901; 257/734
See application file for complete search history.

(56) References Cited

U.S. PATENT DOCUMENTS

| | | | |
|---|---|---|---|
| 4,413,877 A | | 11/1983 | Suzuki et al. |
| 5,110,668 A | * | 5/1992 | Minnick .................... 428/215 |
| 5,846,681 A | | 12/1998 | Yu et al. |
| 6,426,310 B1 | * | 7/2002 | Kurumatani et al. ........ 442/415 |

FOREIGN PATENT DOCUMENTS

| | | |
|---|---|---|
| JP | 62063683 | 3/1987 |
| JP | 63-276813 | 11/1988 |
| JP | 2-131934 | 5/1990 |
| JP | 6-256960 | 9/1994 |
| JP | 06-256960 | 9/1994 |
| JP | 2622016 | 4/1997 |
| JP | 10-183358 | 7/1998 |
| JP | 11-117060 | 4/1999 |
| JP | 11-220254 | 8/1999 |
| JP | 11-240106 | 9/1999 |

OTHER PUBLICATIONS

Machine Translation, JP 06256960, Tumiya et al., Sep. 1994.*
English Abstract, JP 02131934, Morita et al., May 1990.*
Campbell, Ian M., Introduction to Synthetic Polymers, Oxford University Press, 1994, p. 172.*
CAS Structure for poly-p-phenyleneterephthalate.*

* cited by examiner

*Primary Examiner*—Robert Sellers
(74) *Attorney, Agent, or Firm*—McDermott Will & Emery LLP

(57) ABSTRACT

A member useful in a printed wiring board comprises a resin insulating layer, a metallic fine particle or catalyst layer, a metal oxide layer, and a metallic or electroless plating layer, wherein the resin insulating layer contains a resin containing an aromatic amide site such as an epoxy-terminated aromatic polyamide.

3 Claims, 7 Drawing Sheets

MEMBER HAVING METALLIC LAYER, ITS MANUFACTURING METHOD AND ITS APPLICATION

This application is a continuation of application Ser. No. 10/130,851 filed May 23, 2002, which is a 371 of PCT/JP99/06597 filed Nov. 26, 1999.

TECHNICAL FIELD

This invention relates to a novel member having a metallic layer and its manufacturing method, and particularly to a member having a metallic layer used as an elementary material or a constitutional element of electronic parts such as printed wiring board, flexible printed (wiring) board, TAB tape and the like or as an electromagnetic wave shielding material, and to a manufacturing method of said member.

BACKGROUND ART

In view of the current trend of enhancing speed and density in the LSI technique, it is desired today to make the lines more fine, increase the number of layers of electronic circuit wiring and improve the electric characteristics further. For satisfying these requirements, studies are being directed toward manufacturing a multi-layer wiring board by the use of an organic insulating material excellent in flatness, heat resistance, dimensional stability and dielectric characteristics as a substrate.

At the time of forming a layer or a wiring composed of a conductive material and especially of copper on an organic insulating resin substrate by the wet or dry plating process, the most important problem is adhesion between the metallic layer or wiring and the resin substrate board. According to prior art, it has been conventional to roughen the surface of resin board by the method of soft etching or a method of previously incorporating a rubber component into the substrate resin and dissolving out the rubber with a solvent and thereby improve the adhesion of metallic layer deposited on the resin surface by the anchoring effect or mechanical inter locking effect. Details of such prior techniques are summarized in Polymer Surface Modification: Relevance to Adhesion, edited by K. L. Mittal, published by VSP, 1996.

Such prior techniques, however, require to form a concavo-covex pattern having a depth of several tens microns on the substrate surface in order to realize a sufficient adhesion, so that such techniques are not suitable for applications in which a metallic fine pattern having a width smaller than several tens microns has to be formed on the surface. Further, the wiring obtained according to such techniques is unusable for applications for high frequency wave, because the wiring has a concavo-convex pattern reproducing the roughened surface. Further, the process of roughening usually involves a treatment using a sulfuric acid-chromic acid mixture, and the use of such a strong and dangerous corroding solution in a large amount is undesirable form the viewpoint of safety, hygiene and environmental protection. Thus, it is being studied today to replace the anchoring effect or mechanical inter locking effect with an effect of chemical interaction by which the adhesion between resin board and deposited metal can be enhanced.

As the method for realizing a sufficient adhesion between a flat and smooth resin surface and a metal by a chemical interaction, the methods disclosed in Japanese Patent No. 2622016, JP-A-6-256960 and JP-A-11-117060 can be referred to, wherein a surface of a resin containing an amide bond or imide bond in its chemical structure is treated with an aqueous solution containing a mixture of hydrazine hydrate or ethylenediamine and alkali metal hydroxide or treated with a plasma, and then the surface is treated with a catalyst, and then a metallic layer is formed by the electroless plating process. In JP-A-11-220254, there is disclosed a metallic layer-coated resin substrate utilizing the phenomenon that a metal oxide can be bonded, with a high adhesive strength, to a resin surface having an amide bond or an imide bond in its chemical structure and treated with an alkaline aqueous solution, and a method for manufacturing such a resin substrate. If a resin surface is treated with an alkaline aqueous solution or by means of a plasma, a quality-changed resin layer is formed on the resin surface. However, if the quality-changed resin layer exists at the interface between a plating metal layer and a resin, there can often appear an important defect in the reliability of the metallic layer-coated resin substrate. For example, if the substrate is subjected to a pressure-cooker test (PCT test) which comprises heating a board under a high humidity condition, the adhesion between plating metal layer and resin becomes bad extremely, and a swelling or peeling of the metallic layer sometimes occurs, and the product thus obtained is by no means usable. Further, the extent of the quality change and the thickness of the quality-changed resin layer are markedly influenced by intensity, time and temperature of the treatment using the aqueous alkali solution or plasma, and by the formulation of the resin, so that it is difficult to control the extent of quality change and thickness so as to come to optimum values, in high reproducibility. If the quality-changed layer is not formed under optimum conditions, the quality-changed resin layer exhibits no sufficient adhesion to the metallic layer deposited thereon and, in some cases, the catalyst necessary for the electroless plating process cannot be given thereto satisfactorily.

Further, in JP-A-2-131934, it is mentioned that the adhesive force between copper foil and a heterocyclic ring-containing resin (for example, polyimide resin, polyamide-imide resin, etc.) coated onto the copper foil can be improved by providing a layer of copper oxide on the surface of the copper foil. Usually, if a resin is coated onto copper foil in the presence of atmospheric air, a copper oxide layer is formed between the resin and the copper foil. If a heterocyclic ring-containing resin such as polyimide resin, polyamide-imide resin or the like is coated on a flat copper foil, however, the adhesive force between the resin and the foil is not sufficient, so far as evaluated substrated on the force required for peeling off the resin from the foil. Thus, in the actual manufacture of flexible board, etc., a necessary adhesive force is achieved by roughening the surface of copper foil.

JP-A-10-183358 discloses a method for forming a metallic layer on a flat resin surface with a good adhesion without treatment with alkaline aqueous solution or plasma, which comprising carrying out an electroless plating on a resin composition having a combination of a chemical structure containing a nitrogen-hydrogen bond and a salt-forming functional group such as carboxyl group, sulfonic acid group, phosphoric acid group or the like. However, a blending use of a salt-forming agent such as a compound having an ionically dissociating group into a resin composition brings about deterioration of dielectric characteristics, and a metallic layer-coated resin board using such a blended mixture is not usable in electronic materials such as wiring board and the like.

It is an object of this invention to provide a member exhibiting an enhanced adhesion to metal deposited on a resin surface without roughening the surface of the substrate resin, and to a method for manufacturing said member. Preferably, the object of this invention is to obtain a sufficient adhesion without carrying out a quality-changing treatment of resin surface using an alkaline aqueous solution or plasma, nor carrying out a blending of a compound having ionically dissociating group into the resin, said treatment and said blending both deteriorating the reliability of metallic layer-containing member or its electric properties and obstructing a stable manufacture of the metallic layer-containing member, and to provide a build-up type multi-layer wiring board, a flexible wiring board, a wiring substrate board for multi-chip module and a member for forming a plating metal layer which use the above-mentioned member and have an excellent reliability.

DISCLOSURE OF THE INVENTION

The present inventors have discovered that a strong chemical interaction exists between an amide group adjacent to an aromatic ring and an oxide of metal. Based on this discovery, the inventors have studied a deposition (precipitation) of metal onto a surface of a resin having an aromatic amide site. As a result, it has been found that a metal can be deposited (precipitated) onto the surface of the above-mentioned resin with a good adhesion without carrying out a quality-changed layer-forming treatment such as a treatment using an alkaline aqueous solution or a plasma treatment. Based on this finding, this invention has been accomplished. As used herein, the term "aromatic amide site" means a structure in which a nitrogen atom or carbon atom of an amide group is directly linked to an aromatic ring.

This invention provides a member having a metallic fine particle layer or a catalyst layer formed on a resin substrate, a metal oxide layer formed on said metallic fine particle layer or catalyst layer, a metallic layer or electroless plating layer formed on said metal oxide layer, and an electroplated metallic layer formed thereon, characterized in that the resin substrate material is wholly constituted of a resin composition containing a resin having an aromatic amide site in its chemical structure. Preferably, the substrate resin material is constituted of a composition containing a resin having an aromatic amide site represented by the following chemical formula 1, 2, 3 or 4 in its chemical structure. It is also preferable that said substrate resin material is constituted of a resin composition containing a resin having, in its chemical structure, an aromatic amide site represented by the following chemical formula 5 which has an epoxy group or a reacted residue of epoxy group on its molecular terminal.

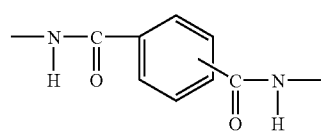
(Formula 1)

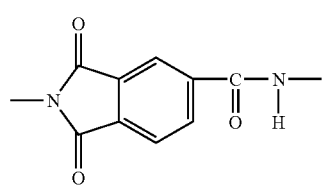
(Formula 2)

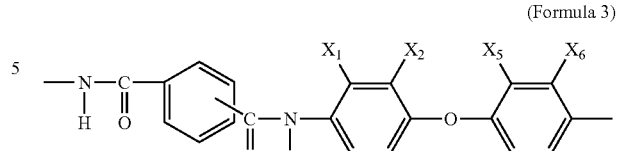
(Formula 3)

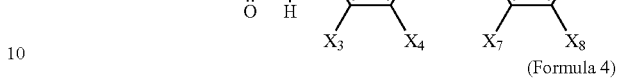
(Formula 4)

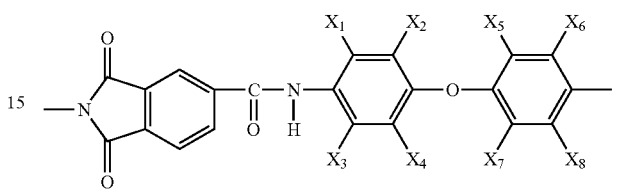
(Formula 5)

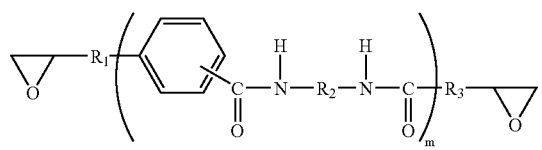

This invention further provides a member comprising a resin composition layer formed on a substrate, a metallic fine particle layer or a catalyst layer formed on said resin composition layer, a metal oxide layer formed on said metallic fine particle layer or catalyst layer, a metallic layer or an electroless plating layer formed on said metal oxide layer, and an electroplating metallic layer formed thereon, characterized in that said member has, between the substrate and the metallic fine particle layer, a resin composition layer containing a resin having an aromatic amide site in its chemical structure and preferably a resin represented by any one of the chemical formulas 1–5.

This invention further provides a method for manufacturing a member having a metallic layer on a resin substrate, characterized in that said resin substrate is wholly constituted of a resin composition containing a resin having an aromatic amide site in its chemical structure, and said method comprises forming a metallic particle layer or a catalyst layer on the surface of said resin substrate, forming a metallic layer or an electroless plating layer on the metallic particle layer or catalyst layer, forming an electroplating metallic layer thereon, and thereafter carrying out a heating treatment in an oxidative atmosphere to form the metal oxide layer on the metallic layer side surface of the interface between the metallic layer and the resin substrate.

This invention further provides a method for manufacturing a member having a metallic layer on a substrate, characterized by forming a resin composition layer containing a resin having an aromatic amide site in its chemical structure on the surface of the substrate, then forming the metallic layer or the plating metallic layer on the metallic particle layer or the catalyst layer formed on the resin composition layer, and thereafter carrying out a heating treatment in an oxidative atmosphere to form the metal oxide layer on the metallic layer side surface of the interface between the metallic layer and the resin composition layer.

This invention further provides a build-up type multi-layer wiring board in which one or a plurality of resin insulating layer(s) and member(s) having a metallic layer functioning as a metallic wiring for each of the insulating layer(s) are laminated on a core wiring base board, characterized in that at least one of said resin insulating layer(s) is constituted of a resin composition containing a resin having an aromatic amide site or said member(s) is constituted of the above-mentioned member.

This invention further provides a flexible wiring board constituted of a member having a metallic layer functioning as a metallic wiring on a insulating resin film, characterized in that said insulating resin film is constituted of a resin composition containing a resin having an aromatic amide site in its chemical structure, and a metallic fine particle layer exists in the insulating resin film side of the interface between the insulating resin film and the metallic wiring, and a metal oxide layer exists in the metallic wiring side, or said member is constituted of the above-mentioned member.

This invention further provides a wiring base board for multi-chip module in which one or a plurality of resin insulating layer(s) and member(s) having a metallic layer functioning as a metallic wiring for each of the insulating layer(s) on a thick film wiring base board, characterized in that at least one of the resin insulating layer(s) is constituted of a resin composition containing a resin having an aromatic amide site, and a metal oxide layer exists at the interface between the resin insulating layer and the metallic wiring, or said member is constituted of the above-mentioned member.

FIG. 1 is a cross sectional view illustrating the member having a metallic layer according to this invention. As shown in FIG. 1, a metallic layer is formed on a substrate constituted of a resin composition containing a resin having an aromatic amide site, said resin composition being used either in the form of the resin composition itself alone or in the form of being reinforced with glass fiber or the like, through intermediation of a metallic fine particle layer and a metal oxide layer.

FIG. 2 is a cross sectional view wherein a metallic layer is formed on a substrate constituted of a resin, metal, ceramic or other material through intermediation of a layer of a composition of a resin having an aromatic amide site, a metallic fine particle layer and a metal oxide layer.

In FIG. 1, at the interface between the resin substrate 11 containing an aromatic amide site and the metallic layer 14, a metal oxide layer 13 exists in the metallic layer 14 side and a metallic fine particle layer 12 exists in the resin substrate 11 side. In FIG. 2, a resin layer 22 containing an aromatic amide site and a metallic layer 25 exist on the substrate 21 constituted of a resin, metal, ceramic or other material and, at the interface between the resin layer 22 and the metallic layer 25, a metal oxide layer 24 exists in the metallic layer 25 side and a metallic fine particle layer 23 exists in the resin layer 22 side. The metallic layer 14 or 25 may be constituted of a single metal or a laminated structure of two or more metallic layers.

The metal oxide layers 13 and 24 are formed by previously depositing metallic layer 14 or 25 on a substrate 11 having an aromatic amide site or a layer 22 having an aromatic amide site, both having a metallic fine particle layer 12 or 23 on its surface, followed by heating or standing in an oxidative atmosphere. In the case of construction shown in FIG. 1, the oxygen necessary for the oxidation treatment is supplied to the interface through the substrate 11 and the metallic fine particle layer 12, so far as the substrate 11 and the metallic fine particle layer 12 are oxygen-permeable. In the construction shown in FIG. 2, the oxygen is supplied to the interface through substrate 21, aromatic amide site-containing resin layer 22 and metallic fine particle layer 23, so far as the substrate 21, aromatic amide site-containing resin layer 22 and metallic fine particle layer 23 are oxygen-permeable. In the construction shown in FIG. 1, when the resin substrate 11 has the construction shown in FIG. 2 and the substrate 21 or resin layer 22 is not oxygen permeable, it is possible to carry out an oxidation treatment by making the oxygen molecules dissolved in resin substrate 11 or resin layer 22 diffuse to the interface.

The effect of this invention can be achieved so far as an aromatic amide site-containing surface and a metal oxide are mutually contacted through intermediation of a metallic fine particle layer. Accordingly, there is no limitation upon the thickness of the resin substrate containing an aromatic amide site 11 or resin layer 22 and the thickness of the metal oxide layer 13 or 24. Although it is preferable that the metallic fine particle layer is evenly provided between resin substrate 11 or resin layer 22 and metal oxide layer 13 or 24, it is also possible that the metallic fine particle layer is present in a partially dispersed manner and therefore resin substrate 11 or resin layer 22 is partially in a direct contact with metal oxide layer 13 or 24.

The metallic fine particles present in the metallic fine particle layer function as nuclei of electroless plating metal depositing reaction and improve the adhesion between the metal oxide layer and the aromatic amide site-containing layer. As the metallic fine particle, fine particle of palladium, silver, or oxides thereof can be used. These fine particles may be used alone or in the form of mixture. Although the metallic fine particles may exist independently of one another in the metallic fine particle layer, preferably they are present in the form of a dispersion in the metal oxide or the aromatic amide site-containing resin. containing metal oxide or aromatic amide site.

As the aromatic amide site-containing resin, totally aromatic polyamide resin (Aramide resin), aromatic polyamide resin, aromatic polyamide-imide resin and the like can be referred to. The use of an aromatic polyamide or aromatic polyamide-imide resin having a reactive group such as epoxy group or the like on its molecular terminal is preferable, because a layer of aromatic amide site-containing resin can thereby be formed on various substrates through the reactive group.

As the metal which can be deposited on the aromatic amide site-containing resin through intermediation of a metallic fine particle layer, those metals of which oxide is relatively stable, such as copper, nickel, cobalt, titanium, chromium and the like, can be referred to. When a member having a metallic layer obtained according to this invention is used as a wiring base board, copper having a low resistance is preferably used among the above-mentioned metals. When a wiring base board is prepared by the use of other metals than copper, it is preferable to prepare a wiring base board after depositing copper thereon.

The formation of the metallic fine particle layer 12 or 23 on the surface of resin substrate containing an aromatic amide site 11 or resin layer 12 can be carried out according to the catalyst-giving treatment generally adopted in the electroless plating process.

As the method for depositing a metal onto the surface of metallic fine particle layer 12 or 23, the electroless plating process can be used. In some cases, a thin film of metal is once formed by these methods and thereafter the metallic layer is thickened by the electroplating process, and such a method is desirable because the period of time required for formation of metallic layer can be shortened. For preparing a wiring base board by the use of the member having a metallic layer provided by this invention, there can be used the so-called subtract method which is a method of depositing a metallic layer on the whole surface of a resin substrate and thereafter preparing a wiring pattern by etching using an appropriate resist, the so-called semi-additive method which is a method of depositing a thin metallic layer on whole surface of a substrate, pasting a resist, depositing a thick-gage metallic layer by electroplating or electroless plating, and thereafter etching out a thin-gage metallic layer from the unnecessary area, and the so-called full additive method which is a method of pasting a resist onto whole surface of a resin substrate and thereafter preparing a conductor wiring by the electroless plating only or by a combination of electroless plating and electroplating.

According to this invention, a member having a metallic layer in which a metallic layer excellent in adhesion is formed on a resin surface by chemical interaction can be provided without treatment using an alkaline aqueous solution or plasma. The present inventors have studied the interaction appearing between an organic functional group and a metal or a metal oxide. As its result, it has been found that an amide group linked to an aromatic ring exercises a particularly marked chemical interaction on a metal oxide.

Copper particles (diameter: 100 μm) having a copper oxide layer on their surface were immersed in an ethanolic solution (concentration: 0.1% by weight) of benzamide having an aromatic amide group to make the benzamide molecules adsorbed onto the copper particle surface. Then, according to the diffusion reflection method, infrared absorption spectrum of the benzamide adsorbed on the copper particle surface was measured, and compared with the infrared absorption spectrum of benzamide itself not adsorbed on the copper particle surface (FIG. 3). As a result, great differences were observed between them in the positions of absorption spectral zones amide I and amide II which are infrared absorption zones assignable to the deformation vibration of nitrogen-hydrogen bond and the stretching vibration of carbon-oxygen bond of amide group, respectively. This clearly demonstrates that copper oxide and aromatic amide group mutually exercise a chemical interaction. In contract to the above, when N-benzylformamide in which an amide group is linked to an aromatic ring through intermediation of a methylene group was adsorbed on copper particle surface according to a similar procedure as above, and the infrared absorption spectrum was measured, the spectrum obtained was equal to that shown by N-benzylforamide itself not adsorbed on copper particle surface (FIG. 4). This result suggests that N-benzylformaide has no chemical interaction with copper oxide and its adsorption onto copper particle is nothing but a physical interaction. Substrated on these results, it can be understood that an aromatic amide group exercises a stronger interaction on copper oxide than the interaction which an amide group not directly linked to aromatic ring does.

Substrated on the result mentioned above, the present inventors have conducted extensive studies on the adhesive force of a resin having an aromatic amide site on a metal oxide layer in various systems. As a result, it has been found that a strong adhesive force is generally exhibited between aromatic amide site-containing resins and metal oxide layers, and the adhesive force is further improved when a fine particle of metal such as palladium, silver and the like or an oxide of such metals is present on the aromatic amide site-containing resin layer. Substrated on this finding, this invention has been achieved.

A catalyst was given to a TORON 4000T resin film manufactured by BP AMOCO Company which is an aromatic amide site-containing polyamide-imide resin by the use of fine particles of palladium, without treating the surface with an alkaline aqueous solution or plasma, then a copper layer was deposited thereon up to a thickness of about 10 nm by electroless plating, and then the copper layer was thickened by forming a copper layer of about 20 μm thereon by electroplating, to form a copper layer. Adhesive strength between the copper layer thus formed and the film was evaluated by a peeling test which was a test for measuring the force necessary for peeling off copper layer from film upward in an angle of 90°. As a result, peeling strength was scarcely observed just after the electroplating; while when the sample was heated in the presence of air at 120° C., the adhesive force markedly increased with heating time, until the peeling strength reached 800 N/m after heating for one hour. When the sample which had been heated for one hour and then subjected to peeling test was visually examined, the peeling surface of copper film assumed a black-brown color to indicate formation of copper oxide on the peeled interface of copper film. Contrariwise, the peeling surface of a copper film piece which had been peeled off from a sample just after the electroplating assumed a color of metallic copper to indicate that the formation of copper oxide layer did not progress in this sample so markedly as in the sample which had been taken after heating for one hour. Substrated on the above-mentioned results, it is understandable that TORON 4000T and copper oxide mutually exercise a very strong interaction, so that they can be brought into a state of tight adhesion without an anchoring effect or a mechanical inter locking effect.

On the other hand, a sample prepared by forming a copper layer of 10 nm thickness by vacuum vapor deposition without deposition of palladium catalyst onto the surface of TORON 4000T film, followed by a thickening of the copper layer by electroplating and a heat treatment, exhibited a peeling strength of 200 N/m. In yet another test, a copper foil-carrying glass epoxy substrate board was heated in the presence of air at 120° C. for one hour to form a copper oxide layer on the copper, and a varnish of TORON 4000T was applied thereon and dried to obtain a TORON 4000T layer having a film thickness of 20 μm. On the sample thus obtained, adhesive force between the TORON 4000T layer and the copper foil-carrying glass epoxy substrate board was measured. As a result, the peeling strength was 50 N/m.

Based on the results mentioned above, it has been become evident that, due to the contact between an aromatic amide site-containing TORON 4000T resin and a copper layer through intermediation of a palladium fine particle-containing layer and a copper oxide layer, the aromatic amide site-containing TORON 4000T resin and the copper layer come into a stronger adhesion than in the case of lacking the palladium fine particle-containing layer.

Thus, it is understandable that the aromatic polyamide site and the copper oxide mutually exercise a very strong interaction, and as its result they can be brought into a tight adhesion without anchoring effect or mechanical inter locking effect. Further, it has also become apparent that the adhesive force can be made more marked by the existence of palladium fine particles at the interface between the aromatic polyamide site-containing layer and the copper oxide layer. A similar result to the above has also been found in the case of combining a surface of other aromatic amide site-containing resin composition substrate with a metal other than copper such as nickel, cobalt, titanium, chromium and the like. As the metallic fine particle, gold, silver, platinum and the like are also usable to give a similar result.

Based on the finding mentioned above which indicates that an aromatic polyamide site and a metal oxide mutually exercise a very strong interaction and, as its result, they can be brought into a tight adhesion without utilizing the anchoring effect or mechanical inter locking effect, the present inventors have tentatively prepared a build-up type multi-layer wiring board, a flexible wiring board and a wiring base board for multi-chip module. As its result, a build-up type

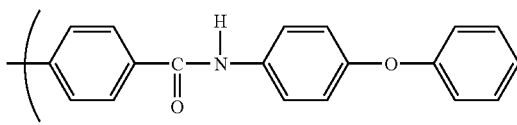

multi-layer wiring board, a flexible wiring board and a wiring base board for multi-chip module having a fine wiring and excellent in reliability have been obtained.

BEST EMBODIMENTS FOR CARRYING OUT THE INVENTION

EXAMPLE 1

Figure 1:
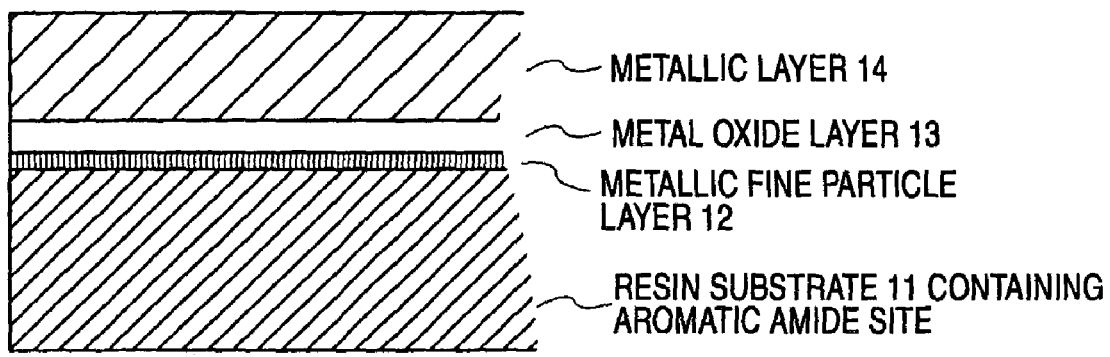
FIG. 1 is a cross sectional view illustrating one construction of the member having a metallic layer according to this invention.
Figure 2:
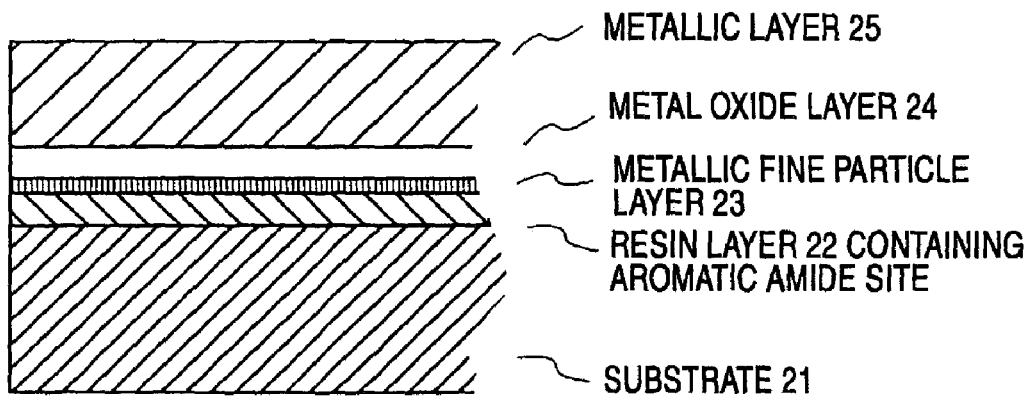
FIG. 2 is a cross sectional view illustrating another construction of the member having a metallic layer according to this invention.
Figure 3:
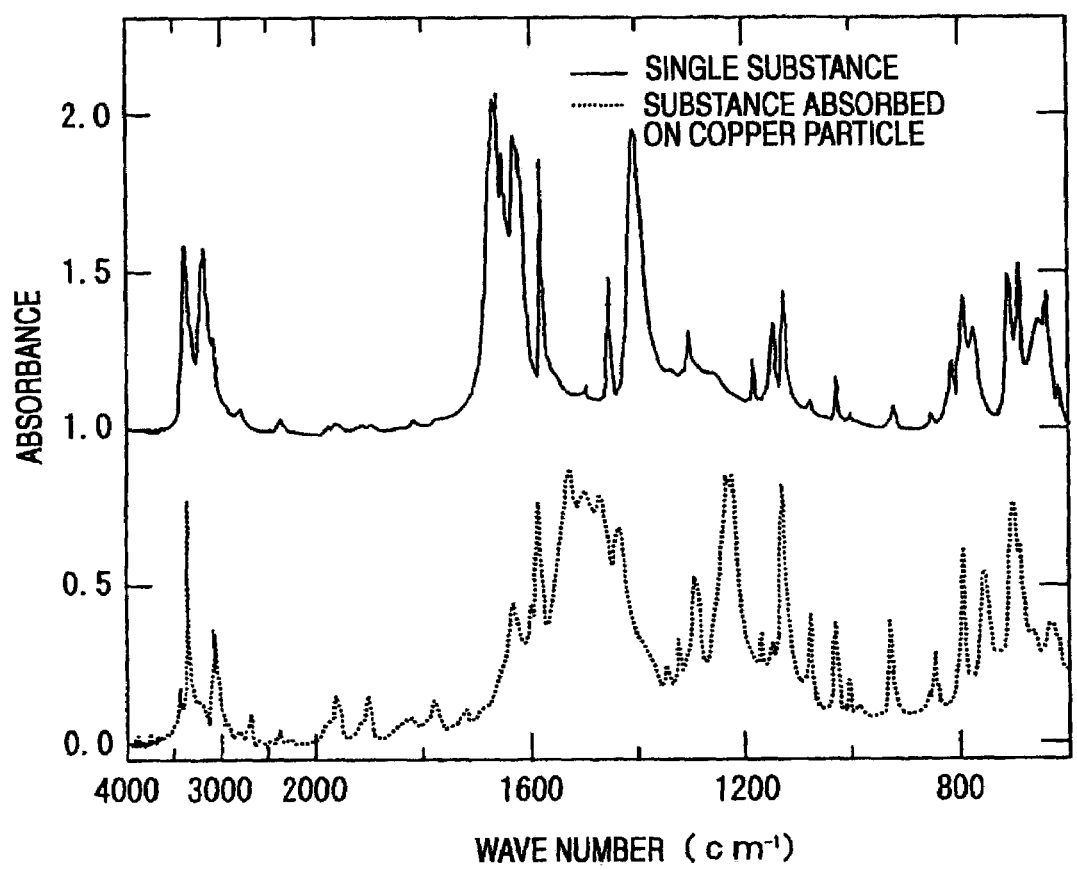
FIG. 3 is a drawing illustrating the infrared absorption spectra of benzamide itself and benzamide adsorbed on copper particle having a copper oxide film.
Figure 4:
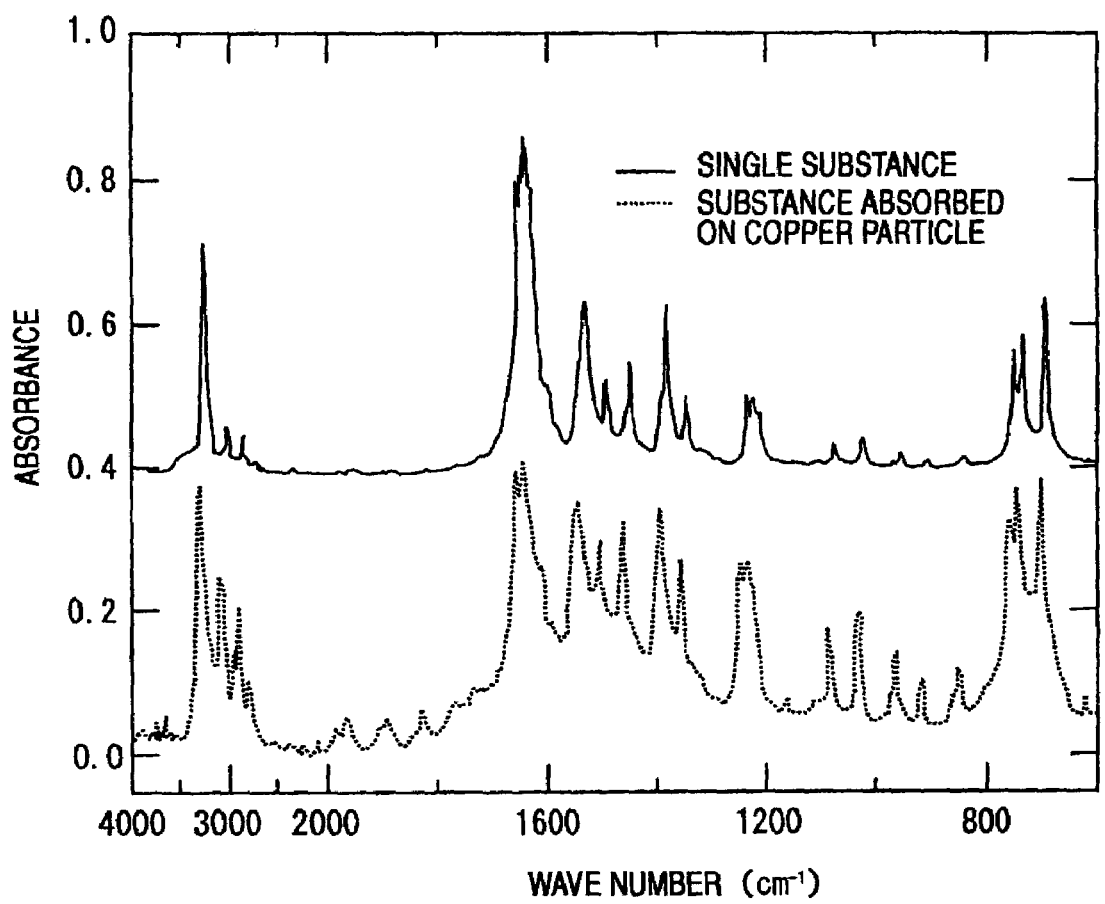
FIG. 4 is a drawing illustrating the infrared absorption spectra of N-benzylformamide itself and N-benzylformamide adsorbed on copper particle having a copper oxide film.

(1) At ordinary temperature, an aromatic polyamide resin having the structure represented by Chemical Formula 6 was synthesized by low temperature solution condensation polymerization of 2,2'-bis(4-aminophenoxyphenyl)propane (manufactured by Mitsui Toatsu Fine K. K.) and p-phthaloyl chloride (manufactured by Wako Junyaku K. K.). As the solvent, N-methyl-2-pyrrolidone (NMP) was used. The polyamide resin thus formed was thoroughly purified by reprecipitation from methanol, vacuum-dried, and recovered. Determination of the molecular weight of the resin thus obtained by GPC gave a weight-average molecular weight of 90,000 and a number-average molecular weight of 45,000.

Subsequently, the aromatic polyamide resin obtained above was dissolved in NMP to prepare a varnish having a concentration of 30% by weight. The varnish was applied to a glass-epoxy substrate LE-67N (manufactured by Hitachi Chemical Co., Ltd.) having a flat and smooth surface by means of a bar coater, and heated and dried in vacuum at 160° C. for 2 hours to obtain a glass-epoxy substrate board coated with an aromatic polyamide resin layer having a thickness of 30 μm.

(2) An aromatic polyamide resin having the chemical structure represented by Formula 7 was synthesized according to the following procedure:

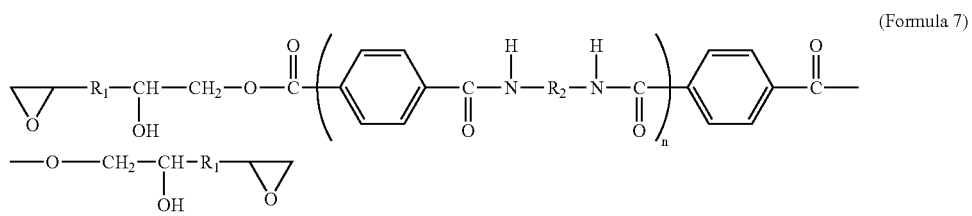

(Formula 7)

wherein $R_1$ represents a divalent organic group of Chemical Formula 8, and $R_2$ represents a divalent organic group of Chemical Formula 9.

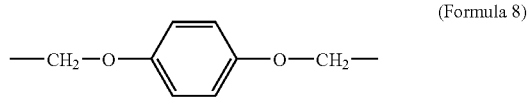

(Formula 8)

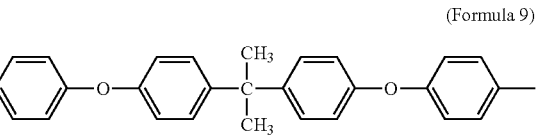

(Formula 9)

First, hydroquinone (manufactured by Wako Junyaku K. K.) was mixed with epichlorohydrin (manufactured by Wako Junyaku) in an atmosphere of nitrogen, into which an aqueous solution of sodium hydroxide having a concentration of 40% was dropped, and the resulting mixture was heated to obtain a compound represented by Chemical Formula 10:

(3) An aromatic polyamide-imide resin having a structure shown in Chemical Formula 11 was synthesized according to the following method.

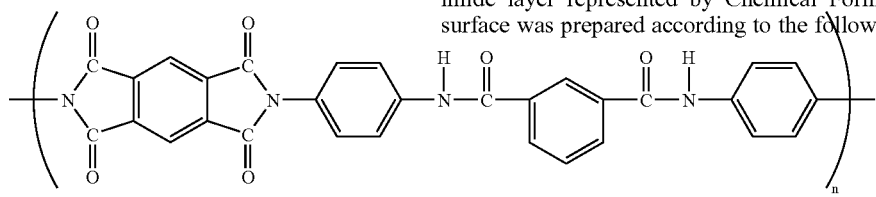

(Formula 11)

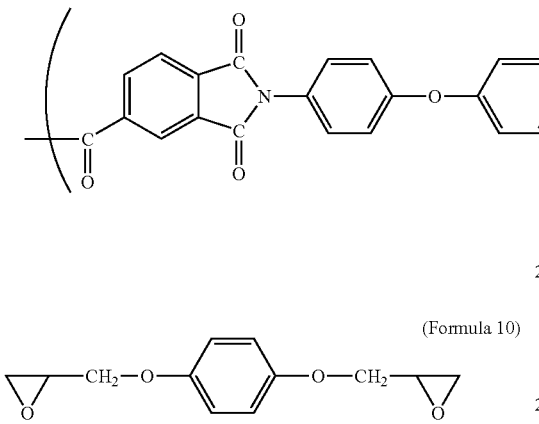

(Formula 10)

Subsequently, an aromatic polyamide resin having a chemical structure represented by Chemical Formula 6 was synthesized by a low temperature solution condensation polymerization of 2,2'-bis(4-aminophenoxyphenyl)propane (manufactured by Mitsui Toatsu Fine K. K.) and p-phthaloyl chloride (manufactured by Wako Junyaku K. K.). As the solvent, NMP was used. By adding the p-phthaloyl chloride in an excessive amount in this reaction, a resin having an acid chloride type molecular chain end was obtained. By re-precipitation from water, the resin thus obtained was recovered, and at the same time the molecular chain end was converted to a carboxyl group. The resin thus obtained was mixed with the compound of Chemical Formula 10 synthesized according to the procedure mentioned above in an NMP solvent, whereby there was obtained an aromatic polyamide resin having an epoxy group on its molecular terminal as shown in Chemical Formula 7. The resin thus obtained had a weight-average molecular weight of 10,000 and a number-average molecular weight of 18,000.

Subsequently, the aromatic polyamide resin obtained above was dissolved in NMP to prepare a varnish having a concentration of 30% by weight. The varnish was applied onto a flat and smooth surface of glass epoxy substrate board LE-67N (manufactured by Hitachi Chemical Co., Ltd.) by means of a bar coater and heated and dried in vacuum at 160° C. for 2 hours to obtain a glass epoxy substrate board coated with an aromatic polyamide resin layer having a thickness of 30 μm.

First, a polyamic acid which is a precursor of aromatic polyamide-imide was synthesized by mixing trimellitic acid chloride anhydride (manufactured by Aldrich Co.) and 2,2'-bis(4-aminophenoxyphenyl)propane (manufactured by Mitsui Toatsu Fine K. K.) at an equimolar ratio and carrying out a low temperature solution polymerization. As the solvent, NMP was used. Then, an excessive amount of acetic anhydride was added to the solution and a ring-closure reaction of the polyamic acid was carried out to obtain an aromatic polyamide-imide having a structure represented by Chemical Formula 11. The aromatic polyamide-imide thus obtained was recovered and purified by re-precipitation from methanol. As evaluated by GPC, its number-average molecular weight was 20,000 and its weight-average molecular weight was 40,000.

Subsequently, the aromatic polyamide-imide resin thus obtained was dissolved in NMP to obtain a varnish having a concentration of 30% by weight. The varnish was applied onto a glass-epoxy substrate board LE-67N (manufactured by Hitachi Chemical Co., Ltd.) having a flat and smooth surface by means of a bar coater, and heated and dried in vacuum at 160° C. for 2 hours to obtain a glass-epoxy substrate board coated with an aromatic polyamide-imide resin layer having a thickness of 30 μm.

(4) A glass substrate board having an aromatic polyamide-imide layer represented by Chemical Formula 12 on its surface was prepared according to the following procedure.

First, m-phthaloyl chloride was prepared by mixing together m-phthalic acid (manufactured by Wako Junyaku K. K.) and thionyl chloride (manufactured by Wako Junyaku K. K.) in THF. Then, the m-phthaloyl chloride and p-phenylenediamine (manufactured by Wako Junyaku K. K.) were mixed together at a ratio of 1:4 in NMP solution to obtain a mixture of N,N'-bis(4-aminophenyl)isophthalamide and p-phenylenediamine. From this solution was recovered N,N'-bis(4-aminophenyl)isophthalamide by recrystallization. Then, the N,N'-bis(4-aminophenyl)isophthalamide thus obtained was mixed with an equimolar amount of pyromellitic acid anhydride (manufactured by Wako Junyaku K.

K.) in an atmosphere of nitrogen and carrying out a low temperature solution polymerization to obtain polyamic acid which is a precursor of polyamide-imide. The polyamic acid thus obtained was purified and recovered by re-precipitation from methanol, and then dissolved in NMP to obtain a varnish. Then, a glass substrate board having a thickness of 5 mm was immersed in a solution of aminopropyltri-methoxy-silane (manufactured by Tokyo Kasei K. K.) in toluene and heated at 110° C. for one hour to introduce amino group into the surface of the glass substrate board. The polyamic acid varnish prepared according to the above-mentioned procedure was applied onto surface of this substrate board, and baked at 250° C. for 2 hours. Thus, a layer of a polyamide-imide resin represented by Chemical formula 12 was formed on the glass substrate board. The polyamide-imide layer thus obtained had a thickness of 20 microns.

(5) An aromatic polyamide-imide resin represented by Chemical Formula 13 was synthesized according to the following procedure:

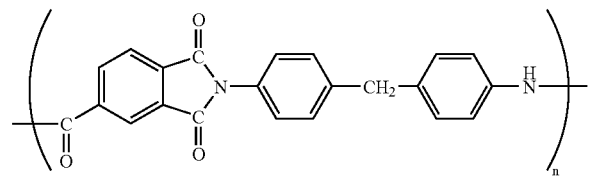

(Formula 13)

First, trimellitic acid chloride anhydride (manufactured by Aldrich Co.) and 4,4'-diaminodiphenylmethane (manufactured by Wako Junyaku K. K.) were mixed together at an equimolar ratio and a low temperature solution polymerization was carried out to synthesize a polyamic acid which is a precursor of aromatic polyamide-imide. In this synthesis, NMP was used as a solvent. Then, an excessive amount of acetic anhydride was added to the solution and the polyamic acid was subjected to ring-closure to form an aromatic polyamide-imide represented by Chemical Formula 13. The polyamide-imide thus obtained was recovered and purified by re-precipitation from methanol. As measured by GPC, its number-average molecular weight was 20,000 and its weight-average molecular weight was 38,000.

The aromatic polyamide-imide resin thus obtained was dissolved in NMP to obtain a varnish having a concentration of 30% by weight. The varnish was applied to a glass-epoxy substrate board LE-67N (manufactured by Hitachi Chemical Co., Ltd.) having a flat and smooth surface by means of a bar coater, and heated and dried in vacuum at 160° C. for 2 hours. Thus, a glass-epoxy substrate board coated with an aromatic polyamide-imide resin layer having a thickness of 30 μm was obtained.

(6) Subsequently, a thin layer of copper was formed on the aromatic amide resin or aromatic polyamide-imide resin of the aromatic amide resin-coated or aromatic polyamide-imide resin-coated base board thus obtained by the electroless plating process according to the following procedure. First, colloidal palladium particles functioning as nuclei of electroless plating were formed on the surface of resin layer by an acid catalyst-giving treatment. This process is generally called "catalyst-depositing activating process". Thus, a substrate board is dipped in hydrochloric acid (concentration: 5.0M) for one minute and then in hydrochloric acid-acidified aqueous solution HS101B (manufactured by Hitachi Chemical Co., Ltd.) (HS101B: 60 ml/l, hydrochloric acid: 3.2M) for 5 minutes, and then washed with water for 3 minutes to have tin-coated palladium colloid adsorbed on the surface of the plated resin. Then, the sample thus obtained was dipped in a hydrochloric acid-acidified oxalic acid solution (concentration: oxalic acid 0.1M, hydrochloric acid 1.0M) for 3 minutes to dissolve off the tin coating layer of the tin-coated palladium colloid adsorbed on the resin surface to form metallic palladium colloid particles. The sample thus obtained was washed with deionized water for 2 minutes and then dipped in an electroless plating solution for 30 seconds to form a thin layer of copper having a thickness of about 10 μm on the surface of the sample resin. It was heated and dried in the presence of air at 120° C. for one hour. The electroless plating solution used in this test was flash electroless plating solution CAST-2000 manufactured by Hitachi Chemical Co., Ltd. The plating solution was prepared with deionized water, and liquid temperature of the plating was adjusted to 40° C.

Thereafter, the thin layer of copper formed by the electroless plating was thickened by electroplating to obtain a copper layer having a thickness of about 20 μm. Formulation of the electro copper plating solution used was as mentioned below. The current density was adjusted to 15 mA/cm$^2$.

[Formulation of Electroplating Solution]

| | |
|---|---|
| Copper sulfate pentahydrate | 0.80 mol/l |
| Sulfuric acid | 0.54 mol/l |
| Sodium chloride | 0.0014 mol/l |

The substrate board thus obtained was dried by heating it in the presence of air at 120° C. for one hour.

The adhesive force of the copper layer formed on the aromatic polyamide layer or aromatic polyamide-imide layer according to the above-mentioned method to a base board was evaluated by the peeling test which comprises measuring the force necessary for peeling off a copper film layer from a base board. Width of the test piece was 5 mm. The results are summarized in Table 1. As seen in Table 1, the peeling strength was as satisfactory as 500–800 N/m. In any runs, the peeling surface of copper assumed a somewhat blackened brown color showing the existence of copper oxide, based on which it was confirmed that a copper oxide layer had been formed in the copper side of the copper-resin interface. Adhesive forces to the surface of resins represented by Chemical Formulas 12 and 13 were smaller than the adhesive force to polyamide resin or polyamide-imide resin having a biphenyl ether bond in the amide site.

Subsequently, a PCT test was carried out for the purpose of evaluating the reliability of the metallic layer-coated resin base thus obtained. Actually, a metallic layer-coated resin base was introduced into a pressure-resistant container together with pure water, and the container was heated at 120° C. for 96 hours. After the test, the pressure-resistant container was allowed to cool, the sample was taken out, and the peeling strength was again measured. The results are shown in Table 1. As seen in Table 1, the values obtained were as good as 450–800 N/m. As has been mentioned above, it is possible to provide a base board having a metallic layer and having an excellent reliability in which the metallic layer has a sufficient adhesive force to the substrate, according to this method.

TABLE 1

| Compound | Peeling strength (N/m) | |
| --- | --- | --- |
| | Before PCT test | After PCT test |
| Compound 6 | 800 | 800 |
| Compound 7 | 700 | 800 |
| Compound 11 | 700 | 650 |
| Compound 12 | 500 | 450 |
| Compound 13 | 500 | 450 |

EXAMPLE 2

By repeating the procedure of Example 1, a metallic layer was formed on glass-epoxy base boards coated with a layer of the aromatic amide resin represented by Chemical Formula 6 and an aromatic amide-imide resin represented by Chemical Formula 11, except that the electroless copper plating adopted in Example 1 was replaced with electroless nickel plating. As the electroless nickel plating solution, B-1 manufactured by Okuno Seiyaku K. K. was used. Adhesive force of the metallic film was evaluated by a peeling test, and the result was 1,200 N/m in the case of Chemical Formula 6 and 1,000 N/m in the case of Chemical Formula 11. As above, by carrying out electroless nickel plating, there can be obtained an adhesive force greater than the adhesive force given by the electroless copper plating of Example 1.

In another experiment, a sample was prepared by bonding Aramica (totally aromatic amide resin film manufactured by Asahi Chemical Industry Co., Ltd.; thickness 25 μm) to a glass-epoxy base board by means of adhesive tape, and thereon was formed a metallic layer having a thickness of about 20 μm by electroless nickel plating and electro copper plating, according to the procedures mentioned above. Then, the copper layer-coated Aramica film was peeled off from the glass-epoxy base board. On the copper layer-coated Aramica film, the adhesive force of metallic layer was evaluated, and the peeling strength was found to be 400 N/m. As above, on an Aramica film, the plating film can be made tightly bonding by carrying out an electroless plating of nickel and then thickening the layer with copper. However, the adhesive force thus obtained is smaller than the adhesive force obtained from the resin having a biphenyl ether bond-containing structure in the amide site.

EXAMPLE 3

The aromatic polyamide resin obtained in Example 1 of which structure is shown by Chemical Formula 6 was poured into a Teflon dish having a diameter of 5 cm and a depth of 2 cm, and heated at 120° C. for 2 hours and thereafter at 160° C. for 3 hours in vacuum to vaporize off the solvent, whereby a resin board having a thickness of about 0.5 mm was obtained. By the same procedure as above, a resin of Chemical Formula 11, a resin of Chemical Formula 13 and a polyamide-imide resin (TORON 4000T manufactured by BP Amoco Co.) were separately dissolved in NMP to prepare varnishes having a concentration of 30% by weight, and the solvent was vaporized off from the varnishes to obtain respective resin boards. On one side surface of each resin board thus obtained, a copper layer having a thickness of about 20 μm was formed according to the procedure shown in Example 1. Adhesive forces of the metallic layers thus obtained to the resins were evaluated by a peeling test. As a result, the adhesive force was 800 N/m for the resin of Chemical Formula 6, 600 N/m for the resin of Chemical Formula 11, 500 N/m for the resin of Chemical Formula 13, and 600 N/m for TORON 4000T.

Subsequently, a varnish of the polyamic acid obtained in Example 1(4) was poured into a dish having a diameter of 5 cm and a depth of 2 cm, and heated at 120° C. for 2 hours and then at 250° C. for 2 hours to obtain a board made of the polyamide-imide resin layer represented by Chemical Formula 12. Its thickness was 0.5 mm. According to the procedure shown in Example 1, a copper layer having a thickness of about 20 μm was formed on the surface of this resin board. As evaluated by a peeling test, the adhesive force of the metallic layer thus formed to the resin board was 500 N/m.

All the samples assumed a somewhat blackish brown color indicating the existence of copper oxide, substrated on which formation of a copper oxide layer on the copper side of the copper-resin interface was confirmed. As above, a sufficient adhesive force can be attained even on an aromatic polyamide resin itself or an aromatic polyamide-imide resin itself. The adhesive forces of the compounds of Chemical Formula 12 and Chemical Formula 13 are smaller than that of the polyamide or polyamide-imide resin itself having a biphenyl ether structure in the amide site.

EXAMPLE 4

A varnish having a concentration of 30% by weight was prepared by dissolving polyamide-imide resin TORON 4000T (manufactured by BP Amoco Co.) or AI-10 in NMP. The varnish was applied to a glass-epoxy base board by means of a bar coater and heated and dried at 160° C. for 2 hours in vacuum. Thus, a glass-epoxy base board coated with TORON 4000T layer or AI-10 layer having a thickness of about 10 μm was obtained. Then, a copper layer was formed on the TORON 4000T layer or AI-10 layer of the base board thus obtained by the same procedure as in Example 1, and the adhesive force was evaluated. As a result, the peeling strength was 600 N/m for the TORON 4000T layer and 500 N/m for the AI-10 layer. The surface of the peeled-off copper film assumed a somewhat blackish brown color to indicate the existence of copper oxide, based on which formation of a copper oxide layer in the copper side of the copper-resin interface was confirmed. By the method mentioned above, a copper-plating film having a sufficient adhesive force to TORON 4000T and AI-10 can be formed.

EXAMPLE 5

(1) Thirty grams of an aromatic polyamide resin having the chemical structure of Chemical Formula 7 and 70 g of Epikote 828 manufactured by Yuka Shell Epoxy Co. were dissolved in y-butyrolactone so that the total concentration came to 30% by weight and then 4 g of dicyanodiamine manufactured by Wako Junyaku K. K. was added as a curing agent, whereby a varnish was obtained. The varnish was poured into a Teflon dish, and heated at 120° C. for one hour and then at 180° C. for 2 hours to vaporize off the solvent and to make react the epoxy groups of the Epikote 828 and the aromatic polyamide resin represented by Chemical Formula 7. Thus, curing took place to form a resin composition board having a thickness of about 0.5 mm.

Subsequently, a copper layer was formed on this resin composition board according to the same procedure as in Example 1. On the copper layer-coated resin composition thus obtained, the adhesion between the copper layer and the surface of resin composition was evaluated to obtain a result that the peeling strength was 400 N/m. All the surfaces of the copper films peeled off assumed a somewhat blackish brown color indicating the existence of copper oxide, based on which formation of copper oxide layer in the copper side of the copper-resin interface was confirmed. As above, an aromatic polyamide resin having a chemical structure of Chemical Formula 7 can be blended with other epoxy material and cured. Although it is generally difficult to plate an epoxy material or the like with metal, the adhesion of plating film to these resins can be improved by using the above-mentioned method.

EXAMPLE 6

An aromatic polyamide chain having a structure of Chemical Formula 7 synthesized according to the procedure of Example 4 was grafted onto a 4-inches silicon wafer. First, a silicon wafer was dipped in an aqueous solution of a neutral surfactant, the surface was cleaned by an ultrasonic treatment, and then the wafer was thoroughly washed with water. The silicone wafer was immersed in a 3:7 mixed solution of 30% aqueous hydrogen peroxide and concentrated sulfuric acid (Piranha solution) for 60 minutes, whereby the organic polluting substances adsorbed on the surface were decomposed and, at the same time, hydroxyl groups were introduced into the surface. Then, amino groups were introduced into the surface of the silicon wafer thus obtained by a treatment using a silane coupler manufactured by Tokyo Kasei K. K. Actually, the substrate board was immersed in an ethanolic solution of aminopropyltrimethoxysilane (concentration 0.3% by weight) for 12 hours, then thoroughly washed with pure ethanol, and thereafter heated at 120° C. for 2 hours to introduce amino groups into the surface of silicon wafer. Next, a resin having a structure of Chemical Formula 7 was dissolved in tetrahydrofuran to prepare a solution having a concentration of 4.0% by weight. The amino group-introduced silicon wafer obtained above was dipped in this solution, withdrawn gently, and dried in the presence of air to form a thin layer of silicon wafer of the resin having the structure of Chemical Formula 7 on the surface of the wafer. Then, the base board was heated at 150° C. for one hour to induce a reaction between the amino group introduced into the silicon wafer surface and the epoxy group at the molecular chain end of the polymer having the structure of Chemical Formula 7, and thereby to form a chemical combination. Finally, the base board thus obtained was dipped in tetrahydrofuran and thoroughly washed to dissolve away the resin unreacted with the amino group from the wafer surface. Thickness of the polymer chain layer on the wafer was evaluated by ellipsometry to obtain a result that the thickness was 8 nm.

A copper layer having a thickness of 15 μm was deposited on the surface of the silicon wafer grafted with aromatic amino group-containing polymer chains, by the same procedure as in Example 1. The adhesive force of copper layer in the copper layer-coated silicon wafer thus obtained was evaluated by a peeling test to obtain a result of 200 N/m. Considering the fact that the adhesive force between an untreated silicon wafer and copper is so weak that copper layer peels off from the silicone wafer surface due to the tension of copper layer when thickness of copper layer formed by electroless copper plating has reached only several tens nm, it can be said that the adhesive force between copper layer and silicon wafer can greatly be improved by the grafting of aromatic amino group.

A copper layer having a thickness of 15 nm was formed on a glass base board by the same procedure as above. On the copper layer-coated glass base board thus obtained, the adhesive force of copper layer was evaluated by a peeling test. The result obtained was 200 N/m. Considering the fact that the adhesive force between an untreated glass base board and copper is so weak that copper layer peels off from the glass base surface due to the tension of copper layer when thickness of copper layer formed by electroless copper plating has reached only several tens nm, it can be said that the adhesive force between copper layer and glass base board can greatly be improved by the grafting of aromatic amino group.

EXAMPLE 7

A thin layer of aromatic polyamide resin or aromatic polyamide-imide resin having a structure of Chemical Formula 6 or 11 was formed on an epoxy base board by the same procedure as in Example 1. Subsequently, a copper layer having a thickness of 10 nm was formed on the surface of the aromatic polyamide resin or aromatic polyamide-imide resin by the electron beam-heating vacuum vapor deposition method. The vapor deposition was carried out in an atmosphere having a vacuum of $1.5 \times 10^{-3}$ Pa while maintaining the substrated board temperature at 120° C. The rate of vapor deposition was 2 nm/sec. Then, the base board thus obtained was heated in the presence of air at 120° C. for one hour. Subsequently, the copper layer was thickened to about 20 μm by the same electroplating method as in Example 1, and then heated in the presence of air at 120° C. for one hour. As evaluated by a peeling test, the adhesive force of the metallic layer was 200 N/m. The surface of the peeled copper film assumed a somewhat blackish brown color, indicating the existence of copper oxide, based on which formation of a copper oxide layer in the copper side of the copper-resin interface was confirmed. It is apparent from the results mentioned above that the adhesive force obtained in the case where no palladium fine particles exist at the interface between a copper oxide layer and a thin layer of an aromatic polyamide resin represented by Chemical Formula 6 or aromatic polyamide-imide resin represented by Chemical Formula 11 is somewhat inferior to the adhesive force obtained in the case where palladium fine particle exist at the interface between the copper layer and the resin layer, namely the case of Example 1.

EXAMPLE 8

A copper layer having a thickness of about 10 nm was deposited on a glass-epoxy base board coated with a layer of aromatic polyamide resin or aromatic polyamide-imide resin represented by Chemical Formula 6, 7 or 11, according to the same procedure of electroless plating as in Example 1. The base board thus obtained was dried under a stream of dry nitrogen gas at ambient temperature, without heating. Then, electro copper plating was carried out onto the copper layer of this base board, without carrying out the copper oxide-forming treatment of Example 1 at the resin/copper layer interface. As a result, it was found that adhesive force of the electro-plating film was considerably weak.

EXAMPLE 9

According to the same procedure as mentioned in Example 1, a glass-epoxy base board coated with a layer of aromatic polyamide resin or aromatic polyamide-imide resin having a structure represented by Chemical Formula 6, 7 or 11 and a glass-epoxy base board coated with TORON 4000T layer of Example 4 were obtained. Then, the base board thus obtained was dipped in an aqueous solution of sodium hydroxide having a concentration of 2.5 mol/l for 2 minutes at a temperature of 25° C. to form a quality-changed layer on the aromatic polyamide resin surface and the TORON 4000T layer surface. On the quality-changed layer of these base boards, electroless plating and electroplating were carried out according to the procedure shown in Example 1 to form a copper layer having a thickness of about 20 μm.

Adhesive force of the copper film formed on the quality-changed layer by the above-mentioned method to the base board was evaluated by a peeling test. As a result, on all the samples except for TORON 4000T, the peeling strength was as sufficient as 800 N/m. In these samples, the peeled copper surface assumed a blackish brown color, based on which formation of a copper oxide layer in the copper side of the copper-resin interface was confirmed. On the other hand, the plating film on the TORON 4000T showed a peeling strength of 50 N/m, which was so low as not suitable for practical applications. However, even the metallic layer-coated resin substrates which had shown a sufficient adhesive force were not sufficient in reliability as evaluated by PCT test. Thus, after a PCT test, the copper layers mostly peeled off from the surface of base board. Although some areas were free from the peeling, the peeling strength in such areas was 10 N/m, roughly saying. That is, the adhesive force was considerably lower than that found before the test. As above, the result was better in the samples where the treatment of resin surface with aqueous alkali solution was not carried out than in the samples where the treatment was carried out.

EXAMPLE 10

Figure 5:
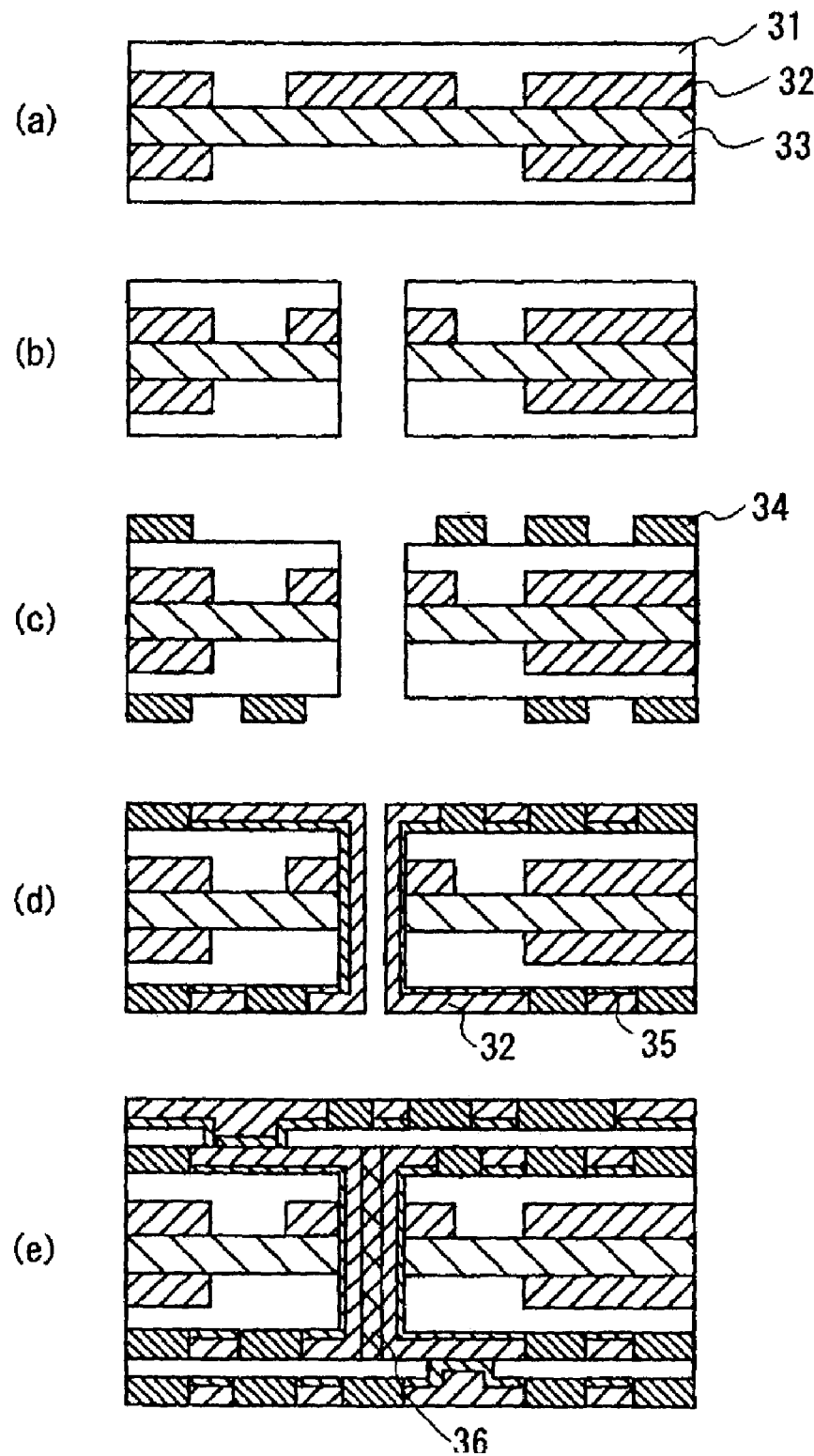
FIG. 5 is a chart schematically illustrating the manufacturing process of a build-up multi-layer printed wiring board according to the full additive method.

Here is presented one example of application of this invention to a build-up multi-layer printed wiring board. FIG. 5 illustrates the process diagram.

Glass-epoxy substrate board 33 in which an inner layer circuit was formed by etching was coated with a varnish prepared by dissolving a polyamide-imide resin (TORON 4000T) in NMP (concentration: 30% by weight) and dried in vacuum at 160° C. to prepare a polyamide-imide layer 31. Then, the surface of the base board thus obtained was ground with buff to flatten the surface, and the board was cut into a desired size to obtain an inner layer core base board (FIG. 5(a)). Subsequently, through-holes of 0.3 mmφ were formed at the predetermined positions by means of NC drill (FIG. 5(b)). A catalyst was given to the surface of the polyamide-imide layer 31 and the inner surface of the through-holes under the same conditions as mentioned in Example 1. Then, a photosensitive negative dry film SR-3000 (manufactured by Hitachi Chemical Co., Ltd.) was laminated onto the surface of the sample by means of low pressure laminator. Then, the sample was irradiated with ultraviolet ray at a dosage of 180 mJ/cm$^2$ through a mask having a wiring pattern, spray-developed with a 20% alcohol type developer, and washed with water to form a plating resist 34 pattern (FIG. 5(c)). The resist had a minimum line-space distance of 20 μm. Then, after depositing nickel upto a film thickness of about 10 nm with an electroless nickel plating solution B-1 (manufactured by Okuno Seiyaku K. K.), the sample was baked in the atmospheric air in an electric oven at 180° C. for 2 hours. Then, the sample was dipped in an aqueous solution of palladium chloride (1 g/l) for one minute and introduced into a full build electroless copper plating bath, and a copper plating was carried out. The full build electroless copper plating solution had the following formulation:

[Formulation of Full Build Electroless Copper Plating Solution]

| | |
|---|---|
| Copper sulfate pentahydrate | 0.04 mol/l |
| Disodium ethylenediaminetetraacetate | 0.1 mol/l |
| Formaldehyde | 0.03 mol/l |
| Sodium hydroxide | 0.1 mol/l |
| 2,2'-Bipyridyl | 0.0002 mol/l |
| Polyethylene glycol (average molecular weight 6,000) | 0.03 mol/l |

After carrying out the plating for 10 hours and then heating in an electric oven at 180° C. for one hour, a copper wiring 32 was formed up to a film thickness of about 20 μm (FIG. 5(d)). A good adhesion was exhibited, without any peeling between the copper wiring part and the polyamide-imide layer.

Subsequently, the surface of the wiring board obtained by the above-mentioned procedure was ground with buff to flatten the surface, after which the inner space of through-holes was filled up with a hole-filling ink 36. Then, polyamide-imide insulating layers were formed on both surfaces according to the method mentioned above. Interlayer connecting holes (φ 50 μm) were perforated at predetermined positions of the surface of the second insulating layer by means of carbon dioxide laser, and the residue was removed by a de-smearing treatment. Then, the same procedure as in the formation of the first wiring layer was repeated to form the second layer conductor circuit pattern on the second insulating layer and, at the same time, the connection conductor part in the connection hole connecting the first layer conductor circuit and the second layer conductor circuit (FIG. 5(e)). After cutting the base board thus obtained by means of a dicer, the surface of cutting was ground and examined under an optical microscope and a scanning electron microscope. Thus, it was confirmed that a copper wiring pattern well reproducing the shape of resist was formed, a copper wiring circuit pattern having a line/space distance of 20 μm was formed on both the first conductor circuit layer and the second conductor circuit layer, and the copper plating well adhered to the inner wall of hole even in the interlayer connection hole so that an electric connection could be surely achieved. When this base board was allowed to stand in the atmospheric air at 150° C. for 1,000 hours, neither breakage of line nor peeling of line was observed, and the wiring base board retained a high reliability to the work at a high temperature over a long period of time.

EXAMPLE 11

Figure 6:
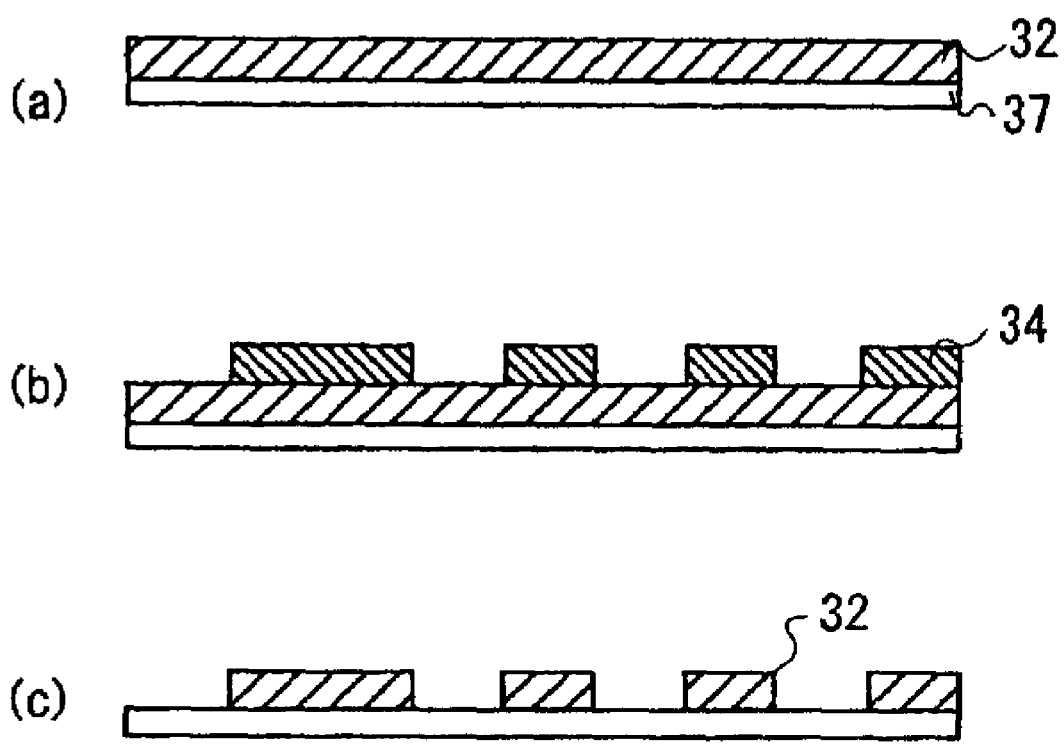
FIG. 6 is a chart schematically illustrating the manufacturing process of a flexible wiring board according to the full additive method.

FIG. 6 illustrates the manufacturing process of a flexible wiring board having a wiring on one surface of a totally aromatic amide resin film 37 according to subtract method. First, a copper layer 32 having a thickness of 20 μm was formed on an Aramica film (totally aromatic amide resin film manufactured by Asahi Kasei Kogyo K. K.) having a thickness of 25 μm according to the procedure of Example 17 (FIG. 6(a)). Then, an etching resist film 34 (Photek, H-K815, manufactured by Hitachi Chemical Co., Ltd.) was laminated onto the surface of the copper layer by means of hot roll. Then, ultraviolet ray was irradiated at a dosage of 100 mJ/cm$^2$ through a mask having a wiring pattern, after which a spray-development was carried out with 1% aqueous solution of sodium carbonate, and further the product was washed with water to obtain an etching resist pattern (FIG. 6(b)). Subsequently, the plating film in the unnecessary area was spray-etched off with an aqueous solution of ferric chloride, the product was washed with water, and then the etching resist film was removed with an aqueous solution of sodium hydroxide to prepare a copper wiring. By the procedure mentioned above, a flexible wiring board free from peeling of wiring and breakage of wiring was obtained (FIG. 6(c)).

EXAMPLE 12

Herein is mentioned a method for manufacturing a base board for multi-chip module formed by laminating, on a ceramic base board, a wiring board provided with a copper wiring on an insulating resin film by the full additive method according to the conventional film-thickening process. Hereunder, one example of the process for manufacturing a multi-chip module in which six layers of multi-layer wiring resin bases are provided on a ceramic base board and LSI chips are mounted by the flip chip bonding method will be mentioned.

Figure 7:
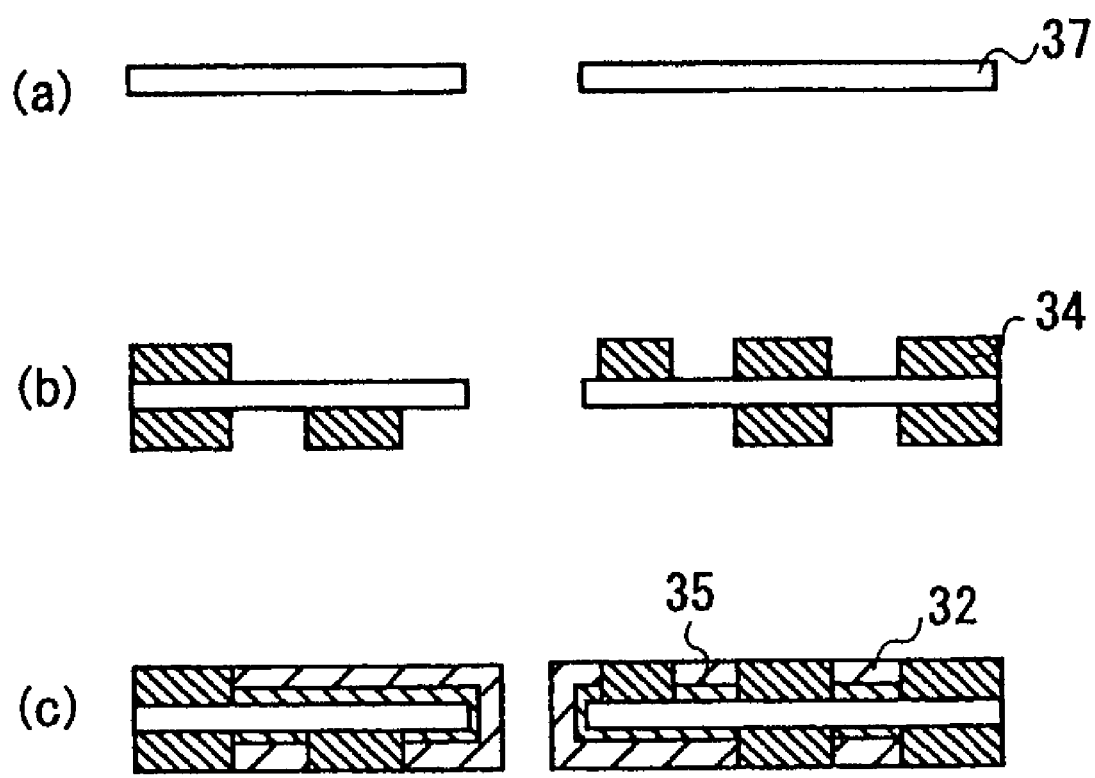
FIG. 7 is a chart schematically illustrating the manufacturing process of a wiring sheet having a wiring layer formed on a resin film.

First, according to the procedure of full additive method shown in FIG. 7, a wiring sheet having wiring layers in which copper wirings are formed on both sides of Aramica (totally aromatic amide resin film, manufactured by Asahi Kasei K. K.) having a thickness of 9 μm was prepared. First of all, interlayer connection holes (φ50 μm) were perforated by means of excimer laser (KrF) at predetermined positions of a totally aromatic amide resin film 37, and the residue was removed by a de-smearing treatment (FIG. 7(a)). Then, a catalyst was given to both surfaces of this film and the inner surface of the connection holes under the conditions mentioned in Example 1. Subsequently, a photosensitive negative dry film KARUDO DRF (manufactured by Nippon Steel Chemical Co., Ltd.) was laminated onto the surface of the sample by means of a low pressure laminator. Then, the sample was irradiated with ultraviolet ray at a dosage of 200 mJ/cm$^2$ through a mask having a desired wiring pattern, a spray-development was carried out with a tetramethylammonium hydroxide developer, and the product was washed with water to obtain a plating resist pattern 34 (FIG. 7(b)). The minimum line/space was 20 μm. Then, nickel layer 35 was formed up to a layer thickness of about 10 nm by means of an electroless nickel plating solution (B-1, manufactured by Okuno Seiyaku K. K.). The sample thus obtained was baked in the atmospheric air in an electric oven at 180° C. for 2 hours. Then, the sample was dipped in an aqueous solution of palladium chloride (1 g/l) for one minute, and then a copper plating was carried out with the thickening electroless copper plating solution mentioned in Example 20. Even when the plating was continued for 10 hours, no peeling was observed, and a wiring sheet having copper wiring 32 having a film thickness of about 20 μm on both sides thereof could be obtained (FIG. 7(c)). Further, by the same procedure as above, two sheets of wiring sheet having a prescribed wiring layer only on one side of Aramica film were prepared.

Figure 8:
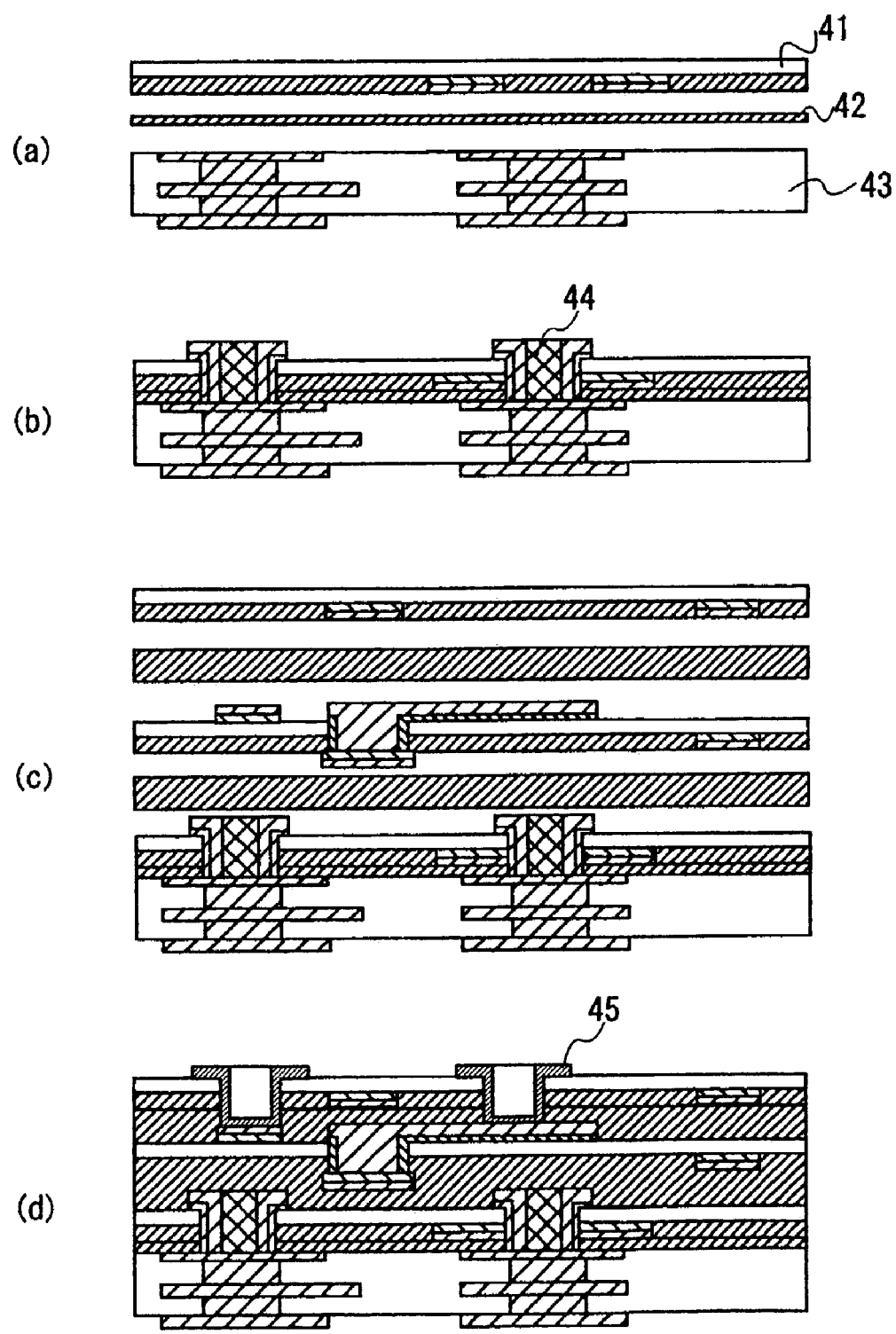
FIG. 8 is a chart schematically illustrating the manufacturing process of a multi-chip module substrate board.

Subsequently, according to the procedure shown in FIG. 8, wiring sheets 41 prepared by the above-mentioned method were successively bonded onto a ceramic base board 43. First, a sheet having a wiring only on one side was bonded through intermediation of an adhesive film 42 (N4, manufactured by Hitachi Chemical Co., Ltd., bonding temperature 250° C., film thickness 10 μm) so that the copper wiring layer side came into contact with the adhesive film (FIG. 8(a)) by means of a parallel plate press. Then, in order to make en electric connection between the bud part on the ceramic base board and the wiring layer, interlayer connection holes (φ50 μm) were perforated at predetermined positions by means of carbon dioxide laser and the residue was removed by a de-smear treatment, after which the inside of the connection holes was metallized up to a film thickness of 5 μm by a selective copper plating method and then copper paste 44 was filled into the holes (FIG. 8(b)). Further, a wiring sheet having wirings formed on both sides thereof was bonded onto the wiring sheet through intermediation of the same adhesive film as above by means of a parallel plate press. Then, a sheet having a wiring on its one side was bonded through intermediation of the same adhesive film as above so that the copper wiring layer side came into contact with the adhesive film, by means of a parallel plate press ((FIG. 8(c)). Prescribed positions of the surface of the laminated sheet were perforated with a carbon dioxide laser to form a surface layer (Cr/Ni/Au) 45 (FIG. 8(d)). Then, by flip chip bonding, a plurality of LSI chips were mounted to prepare a multi-chip module. On this wiring substrate board, neither breakage of line nor peeling of line was observed even after a solder connection process, demonstrating a high reliability of the multi-chip to high temperature process.

INDUSTRIAL UTILIZABILITY

According to this invention, there can be provided a member having a metallic layer enhanced in the adhesive force between the resin surface and the metal deposited thereon due to a chemical interaction without roughening the resin surface, and a method for manufacturing said member. Since it is unnecessary to provide a quality-changed layer on the resin surface, a member having a metallic layer high in reliability can be provided in a good reproducibility. Further, even from substrate materials of which plating has been impossible to carry out hitherto, a metallic plating layer can be formed by providing an aromatic amide group-containing resin layer on its surface. Further, according to this invention, a flexible wiring board and a wiring board for multi-chip module all excellent in reliability can be provided.

The invention claimed is:

1. A wiring board comprising a member, said member comprising:
    a resin insulating layer;
    a metallic fine particle layer or catalyst layer formed on said resin insulating layer;
    a metal oxide layer formed on said metallic fine particle layer; and
    a metallic layer or electroless plating layer formed on said metal oxide layer,
    wherein the resin insulating layer comprises a resin containing an aromatic amide site in the chemical structure thereof, said resin comprising an epoxy group at a molecular terminal represented by the following chemical formula 5 or a structure having a reacted residue of said epoxy group:

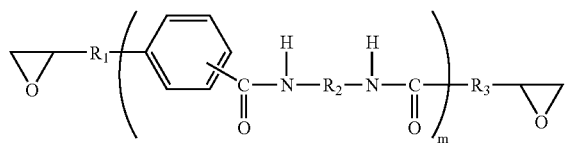
(Formula 5)

wherein $R_1$, $R_2$ and $R_3$ represent a divalent organic group and m represents a natural number.

2. The wiring board of claim 1, further comprising an electroplating metallic layer formed on said metallic layer or electroless plating layer.

3. The wiring board of claim 1, wherein said wiring board is a build-up type multi-layer wiring board, a flexible wiring board or a wiring base board for a multi-chip module.

* * * * *